United States Patent [19]

Loboda et al.

[11] Patent Number: 5,501,875
[45] Date of Patent: Mar. 26, 1996

[54] METAL COATED SILICA PRECURSOR POWDERS

[75] Inventors: Mark J. Loboda; Udo C. Pernisz, both of Midland, Mich.

[73] Assignee: Dow Corning Corporation, Midland, Mich.

[21] Appl. No.: 364,147

[22] Filed: Dec. 27, 1994

[51] Int. Cl.⁶ ........................................................ B05D 7/00
[52] U.S. Cl. ........................ 427/222; 427/212; 427/226; 427/250; 427/387; 106/287.1
[58] Field of Search .................... 427/212, 222, 427/226, 387, 250; 428/403; 106/287.1, 287.14

[56] References Cited

U.S. PATENT DOCUMENTS

| | | | |
|---|---|---|---|
| 4,353,938 | 10/1982 | Sterling et al. | 427/222 |
| 4,624,923 | 11/1986 | Margel | 427/222 |
| 4,640,860 | 2/1987 | Ritchie | 428/143 |
| 4,749,631 | 3/1988 | Haluska et al. | 428/704 |
| 4,756,977 | 6/1988 | Haluska et al. | 428/704 |
| 4,788,082 | 11/1988 | Schmitt | 427/248.1 |
| 4,871,616 | 10/1989 | Kimura et al. | 427/222 |
| 5,021,258 | 6/1991 | McGarry | 427/222 |
| 5,196,267 | 3/1993 | Barder et al. | 427/215 |

Primary Examiner—Shrive Beck
Assistant Examiner—David M. Maiorana
Attorney, Agent, or Firm—Roger E. Gobrogge

[57] ABSTRACT

Disclosed are powders containing silica precursors having metals deposited on their surface. The powders are produced by vacuum evaporation of the metal onto the surface of the powder. These powders are useful for forming colloidal dispersion, gels and ceramics with metals dispersed therein.

17 Claims, No Drawings

5,501,875

METAL COATED SILICA PRECURSOR POWDERS

BACKGROUND OF THE INVENTION

The present invention relates to metal coated powders containing silica precursors. These powders can be mixed with solvents to form colloidal dispersions of the metals. These dispersions, in turn, can be used to form coatings having the metals dispersed in silica-containing matrices.

The use of silica-containing ceramic coatings on substrates such as electronic devices is known in the art. For instance, Haluska et al. in U.S. Pat. Nos. 4,749,631 and 4,756,977 disclose processes for forming silica coatings on electronic substrates wherein solutions of silica precursor resins are applied to substrates followed by heating the coated substrates to form the ceramic coating. These references, however, do not describe the inclusion of metals within the coating.

The use of metals within ceramic matrices are also known in the art (i.e., "cermets"). For instance, Ritchie in U.S. Pat. No. 4,640,860 teaches an optical recording coating comprising a metal disposed in a dielectric matrix. This coating, however, is not formed using the materials and methods of the present invention.

Haluska et al. in U.S. patent application Ser. No. 08/221,594, filed Apr. 4, 1994, teach metal containing ceramic coatings derived from solutions of silica precursors and metals. The solutions used therein, however, are not formed by the process of the present invention.

The present inventors have now discovered that metals can be deposited on powders containing silica precursors, that these powders can be dissolved to form colloidal dispersions of metal in silica precursor solutions, that these solutions can be gelled and that these gels can be converted to silica-containing ceramics with the metals dispersed therein.

SUMMARY OF THE INVENTION

The present invention relates to a method of coating a powder comprising a silica precursor with a metal. The method comprises first placing a powder comprising a silica precursor into a vacuum chamber. Next, the chamber is evacuated and a metal vapor introduced therein. Finally, deposition of the metal onto the surface of the powder is facilitated.

The present invention also relates to powder containing a silica precursor and having a metal coating on its surface.

The present invention also relates to a method of forming a silica-containing ceramic having a metal dispersed therein. The method comprises depositing a metal on the surface of a powder comprising a silica precursor. The powder with the metal on its surface is dissolved/dispersed in a solvent and the mixture deposited on a substrate. The solvent is allowed to evaporate to form a gel and the gel is heated to form the silica containing ceramic with the metal dispersed therein.

DETAILED DESCRIPTION OF THE INVENTION

The present invention is based on the discovery that metals can be deposited on the surface of powders comprising silica precursors and that such powders are useful in forming colloidal solutions, gels and ceramics.

As used in the present invention, the expression "silica containing matrix" is used to describe the hard ceramic obtained after heating the silica precursor. This coating contains both amorphous silica ($SiO_2$) materials as well as amorphous silica-like materials that may not be fully free of residual carbon (eg., Si—C or Si—OC), silanol (Si—OH) and/or hydrogen and the metal. The expression "silica precursor" is used to describe powders which can be converted into silica-containing matrices by heating. The expression "colloidal dispersion" is used to described a suspension of finely divided metal dispersed within a liquid medium.

In the process of the present invention, a metal is first vacuum deposited on the surface of a powder comprising a silica precursor. Vacuum deposition processes are known in the art for depositing metal layers on substrates such as electronic devices. Such processes have not, however, been used for depositing metals on powdered substrates.

In a typical vacuum deposition process, the substrate to be coated is first placed in a vacuum chamber. The vacuum chamber is then evacuated. A vapor of the material to be deposited is then introduced into the chamber. Finally, the vapor is allowed to randomly deposit on the substrate (and the vacuum chamber). The present inventors have now discovered that such processes can be used to deposit metals onto the surface of silica precursor powders.

The vacuum chamber which is used herein is not critical. Nearly any chamber which can hold the substrate and be pumped down to the desired pressure can be used.

Likewise, the pressure used in the chamber is not critical. However, the pressure will have an impact on the size of the metal particles deposited and, thus, the size of the particulate in colloidal dispersion. For instance, if the pressure is kept at less than about $10^{-3}$ millibar (eg., $10^{-3}$ to $10^{-5}$ millibar), the evaporated metal does not agglomerate and atomic metal is deposited (thus, fine particulates in the dispersion). By contrast, if higher pressures are used, the atomic metal may form clusters which are deposited on the substrate (thus, larger particles in the dispersion). It is often preferred to have particle sizes in the range of from the size of the atomic metal up to about 100 nanometers and more preferred to have particle sizes in the range of about 5–20 nanometers.

The metal can be evaporated in any manner desired. One common approach involves placing the metal on a tungsten filament which is then heated to cause the evaporation. An alternative method involves sputtering in a direct current or alternating current electric field between metal electrodes. It should be noted that the evaporation can occur in the chamber or, alternatively, it can occur outside the chamber followed by pumping the metal vapor in.

In addition to the above, a stream of gas may be added to the chamber to direct the evaporated metal at the surface of the substrate (i.e., a "flowing" vacuum). For instance, a stream of nitrogen can be established such that it flows past the evaporation source and onto the substrate. This minimizes the amount of metal which deposits in undesirable areas (eg., the wall of the chamber). Obviously, if a stream of gas is introduced, it must be continuously pumped out to maintain vacuum.

The metals which can be used in this invention are any which will not react with the substrate or solvent and which will survive dispersion, gelling and heating. Examples of such metals include gold, copper, silver, platinum, and chromium. The preferred metal herein is gold.

The substrates used herein are powders comprising silica precursors. The specific powder to be used is not critical as long as it can be converted into a silica-containing matrix by heating. These powders generally include, but are not limited to, hydrolyzed or partially hydrolyzed $R_nSiX_{4-n}$, or combinations of the above. In this formula R is hydrogen or an aliphatic, alicyclic or aromatic substituent of 1–20 carbon atoms such as an alkyl (eg. methyl, ethyl, propyl), alkenyl (eg. vinyl or allyl), alkynyl (eg. ethynyl), cyclopentyl, cyclohexyl, phenyl etc., X is a hydrolyzable substituent such as a halogen (eg., Cl, Br, etc.) or OR and n is 0–3.

Specific compounds of this type include methyltriethoxysilane, methyltrichlorosilane, triethoxysilane, trichlorosilane, phenyltriethoxysilane, phenyltrichlorosilane, diethyldiethoxysilane, methyltrimethoxysilane, dimethyldimethoxysilane, dimethyldichlorsilane, phenyltrimethoxysilane, vinyltrimethoxysilane, vinyltrichlorosilane, tetramethoxysilane, tetraethoxysilane, tetrapropoxysilane, and tetrabutoxysilane. After hydrolysis or partial hydrolysis of these compounds, the silicon atoms therein may be bonded to H, C, OH or OR groups, but a substantial portion of the material is believed to be condensed in the form of soluble Si—O—Si resins. Compounds in which x=2 are generally not used alone as volatile cyclic structures may be generated during pyrolysis, but small amounts of said compounds may be cohydrolyzed with other silanes to prepare useful preceramic materials. Some of these materials are commercially available, for example, under the tradename ACCUGLASS™ and FOx™.

The preferred materials for use herein are hydrogen silsesquioxane resins (H-resin). These are materials formed by the hydrolysis or partial hydrolysis of $HSiX_3$. The resultant resins have the formula $HSi(OH)_x(X)yO_{z/2}$, in which each X is a hydrolyzable substituent as defined above, x=0–2, y=0–2, z=1–3, x+y+z=3. As such, these resins may be fully condensed $(HSiO_{3/2})_n$ or they may be only partially hydrolyzed (i.e., containing some Si—X) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

Methods for producing the above silica precursor powders are known in the art. For example, it is known to hydrolyze an alkoxy or acyloxy silane with water in an acidic, alcoholic hydrolysis medium. Similarly, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Additionally, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

It is to be noted that in a preferred embodiment of the invention, specific molecular weight fractions of the above silica precursor powders may be used. Such fractions and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The powder may also contain other ceramic oxide precursors. Examples of such ceramic oxide precursors include hydrolyzed or partially hydrolyzed compounds of various metals such as aluminum, titanium, zirconium, tantalum, niobium and/or vanadium as well as various non-metallic compounds such as those of boron or phosphorous. These compounds are co-hydrolyzed with the silica precursors and the mixed hydrolyzate pyrolyzed to form mixed ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When a powder is used containing both silica precursors and ceramic oxide precursors, generally the proportion of silica precursor is at least 50 wt. % of the powder.

If hydrogen silsesquioxane resin is used as the silica precursor, the coating composition may also contain a platinum, rhodium or copper catalyst to increase its rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

According to the process of the invention, the powder with the metal deposited on its surface is dissolved/dispersed in a solvent. Various facilitating measures such as stirring and/or heating may be used to dissolve the silica precursor powder and disperse the metal and create a more uniform application material. Solvents which may be used include any agent or mixture of agents which will dissolve the silica precursor powder and disperse the metal to form a uniform liquid mixture without affecting the resultant coating. These solvents can include, for example, alcohols such as ethyl or isopropyl, aromatic hydrocarbons such as benzene or toluene, alkanes such as n-heptane or dodecane, ketones, esters, ethers, or volatile polysiloxanes, in an amount sufficient to dissolve/disperse the above materials to the concentration desired for application. Generally, enough of the above solvent is used to form a 0.1–80 weight percent mixture, preferably 1–50 wt. percent.

It should be noted that after the metal coated powder is dissolved/dispersed in a solvent, additional coating materials can be added to the mixture. For instance, additional silica precursors or ceramic oxide precursors as set forth above can be added.

The liquid mixture comprising the silica precursor, metal, and solvent is then coated onto a substrate. The method of coating can be, but is not limited to, spin coating, dip coating, spray coating or flow coating. Other equivalent means, however, are also deemed to be within the scope of this invention.

The solvent is then allowed to evaporate from the coated substrate to form a gelled silica precursor with the metal dispersed therein. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

The silica precursor and metal gel is then typically converted to a silica-containing ceramic matrix having the metal disbursed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°–425° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$ etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a metal-containing ceramic coating is produced on the substrate. The thickness of the coating can vary over a wide range (eg., up to 500 micrometers). These coatings are relatively defect free and have excellent adhesive properties.

The resultant materials are particularly useful for a optoelectronic and non-linear optical uses. However, they can also be used where metals dispersed in ceramics are valuable (eg., recording media, conductive coatings, magnetic coatings, etc.)

The following non-limiting example is included so that one skilled in the art may more readily understand the invention.

EXAMPLE 1

Hydrogen silsesquioxane resin, 2 g, produced by the method of Collins et al. in U.S. Pat. No. 3,615,272 was pulverized with a mortar and pestle and spread evenly in a 5 cm diameter Petri dish. An evaporator containing a tungsten coil was used for the deposition. The tungsten coil was loaded with gold particles. The Petri dish containing the hydrogen silsesquioxane resin was placed about 20 cm below the tungsten coil. The evaporator was evaporated to $10^{-5}$ millibar. A coating equivalent to 500 nm of gold as measured by a crystal thickness monitor was evaporated on the powder. The powder was removed form the Petri dish and ground in a mortar and pestle. The powder was returned to the Petri dish and the dish returned to the evaporator. The evaporator was again evaporated to $10^{-5}$ millibar and the equivalent to 300 nm of gold as measured by crystal thickness monitor was deposited. The powder was again ground in a mortar and pestle and dissolved in methyl-isobutylketone (MIBK) to make a 20% solution by weight (1.743 g of powder added to 7.30 g of MIBK). The solution was shaken for 20 minutes. The solution was decanted from a deposit of non-colloidal gold which had settled on the bottom of the flask. The solution appeared purple and transparent.

Thin films of this solution were spin coated on a 7059 glass substrate and on a silicon wafer at 3000 rpm for 10 seconds. These films were converted to silica by pyrolysis at 425° C. in air for 1 hour. The thickness of the converted material was between 80 nm and 260 nm.

EXAMPLE 2

Hydrogen silsesquioxane resin, 2.53 g, produced by the method of Collins et al. in U.S. Pat. No. 3,615,272 was pulverized with a mortar and pestle and spread evenly in a 5 cm diameter Petri dish. This dish was placed in the evaporator of Example 1. The evaporator was evaporated to $10^{-5}$ millibar and the equivalent of 200 nm of gold as measured by crystal thickness monitor was deposited. The powder was ground in a mortar and pestle and dissolved with 4.91 g untreated hydrogen silsesquioxane resin in 25.73 g methyl-isobutylketone (MIBK) to make a 22.4% solution by weight. The solution was shaken for 20 minutes. The solution was decanted from a deposit of non-colloidal gold which had settled on the bottom of the flask. The solution appeared purple and transparent.

An absorption measurement of the solution showed that the gold is colloidally dispersed in the solution attached to the hydrogen silsesquioxane resin molecules. The solution was allowed to gel. A small piece of the gel was prepared for analysis by TEM. The results show features in the 10 nm range.

That which is claimed is:

1. A method of coating a powder comprising a silica precursor with a metal comprising:

placing a powder comprising a silica precursor into a vacuum chamber;

evacuating the vacuum chamber;

introducing a vaporized metal into the vacuum chamber; and facilitating deposition of the metal vapor onto the surface of the powder.

2. The method of claim 1 wherein the powder comprises hydrolyzed or partially hydrolyzed $R_nSiX_{4-n}$, wherein R is hydrogen or an aliphatic, alicyclic or aromatic substituent of 1–20 carbon atoms, X is a hydrolyzable substituent and n is 0–3.

3. The method of claim 1 wherein the powder consists essentially of hydrogen silsesquioxane resin.

4. The method of claim 1 wherein the metal is selected from the group consisting of gold, copper, silver, platinum, and chromium.

5. The method of claim 1 wherein the metal is gold.

6. A composition comprising a powder containing a silica precursor and having a metal coating on the surface of the powder.

7. The composition of claim 6 wherein the powder comprises hydrolyzed or partially hydrolyzed $R_nSiX_{4-n}$, wherein R is hydrogen or an aliphatic, alicyclic or aromatic substituent of 1–20 carbon atoms, X is a hydrolyzable substituent and n is 0–3.

8. The composition of claim 6 wherein the powder consists essentially of hydrogen silsesquioxane resin.

9. The composition of claim 6 wherein the metal is selected from the group consisting of gold, copper, silver, platinum, and chromium.

10. The composition of claim 6 wherein the metal is gold.

11. The composition of claim 6 dispersed in a liquid.

12. A method of forming a silica-containing ceramic having a metal dispersed therein comprising:

depositing a metal on the surface of a powder comprising a silica precursor;

dispersing the powder with the metal on its surface in a liquid to form a coating mixture;

applying the coating mixture onto a substrate;

allowing the liquid in the coating mixture to evaporate to form a gel;

heating the gel to form a silica containing ceramic with the metal dispersed therein.

13. The method of claim 12 wherein the powder comprises hydrolyzed or partially hydrolyzed $R_nSiX_{4-n}$, wherein R is hydrogen or an aliphatic, alicyclic or aromatic substituent of 1–20 carbon atoms, X is a hydrolyzable substituent and n is 0–3.

14. The method of claim 12 wherein the powder consists essentially of hydrogen silsesquioxane resin.

15. The method of claim 12 wherein the metal is selected from the group consisting of gold, copper, silver, platinum, and chromium.

16. The method of claim 12 wherein the metal is gold.

17. The method of claim 12 wherein the gel is heated at a temperature in the range of 50° to 1000° C. for up to 6 hours.

* * * * *